(12) United States Patent
Hirose et al.

(10) Patent No.: US 7,012,456 B1
(45) Date of Patent: Mar. 14, 2006

(54) CIRCUIT AND METHOD FOR DISCHARGING HIGH VOLTAGE SIGNALS

(75) Inventors: Ryan T. Hirose, Colorado Springs, CO (US); Vijay Srinivasaraghavan, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 225 days.

(21) Appl. No.: 10/029,530

(22) Filed: Dec. 20, 2001

(51) Int. Cl.
 *H03L 5/00* (2006.01)
(52) U.S. Cl. ...................................... 327/328; 327/546
(58) Field of Classification Search ............... 327/327, 327/328, 427, 434, 436, 437, 536, 545, 546; 365/189.09, 227
See application file for complete search history.

(56) References Cited

U.S. PATENT DOCUMENTS

| | | | |
|---|---|---|---|
| 4,156,940 A * | 5/1979 | Hollingsworth et al. ................... 365/189.09 | |
| 4,794,278 A * | 12/1988 | Vajdic ....................... 327/537 | |
| 4,978,905 A | 12/1990 | Hoff et al. | |
| 5,157,282 A | 10/1992 | Ong et al. | |
| 5,367,489 A * | 11/1994 | Park et al. ............. 365/189.11 | |
| 5,420,798 A * | 5/1995 | Lin et al. ...................... 702/64 | |
| 5,502,405 A | 3/1996 | Williams | |
| 5,506,816 A | 4/1996 | Hirose et al. | |
| 5,530,640 A * | 6/1996 | Hara et al. ..................... 363/60 | |
| 5,600,267 A | 2/1997 | Wong et al. | |
| 5,745,354 A | 4/1998 | Raza | |
| 5,872,464 A | 2/1999 | Gradinariu | |
| 5,952,868 A | 9/1999 | Gowni et al. | |
| 5,956,219 A * | 9/1999 | Maloney ...................... 361/56 |
| 5,973,545 A | 10/1999 | Raza | |
| 6,011,421 A | 1/2000 | Jung | |
| 6,404,229 B1 | 6/2002 | Barnes | |
| 6,477,090 B1 * | 11/2002 | Yamaki et al. ......... 365/189.09 |
| 6,590,420 B1 | 7/2003 | Mnich et al. | |
| 6,590,442 B1 * | 7/2003 | Byeon et al. ................ 327/537 |

* cited by examiner

*Primary Examiner*—Timothy P. Callahan
*Assistant Examiner*—Terry L. Englund
(74) *Attorney, Agent, or Firm*—Dorsey & Whitney LLP

(57) ABSTRACT

A circuit for discharging a high voltage signal to a supply voltage line. In one embodiment, the circuit includes a first switch receiving the high voltage signal; a second switch having an input coupled with the output of the first switch; and a third switch having an input coupled with the output of the second switch and having an output coupled with the supply voltage line. In this embodiment, the high voltage signal discharges to the supply voltage line when the first, second, and third switches are on. The circuit may include a fourth switch for clamping the high voltage signal to ground. The fourth switch may have a control coupled with the output of the first switch along a discharge path such that when the high voltage signal is discharging and approaches a voltage level of approximately ground, the fourth switch automatically turns on and clamps the high voltage signal to ground level. In this manner, after the high voltage signal has discharged, the fourth switch clamps the high voltage signal to a ground potential so that circuit elements coupled with the high voltage signal may operate.

19 Claims, 4 Drawing Sheets

CIRCUIT AND METHOD FOR DISCHARGING HIGH VOLTAGE SIGNALS

CROSS REFERENCE TO RELATED APPLICATION

This application is related to commonly assigned, co-pending patent application Ser. No. 10/029,370, entitled "Level Shifting Circuit and Method" by Thomas Mnich and Ryan Hirose, filed on Dec. 20, 2001, now U.S. Pat. No. 6,590,420 issued Jul. 8, 2003, the disclosure of which is incorporated by reference herein in its entirety.

FIELD OF THE INVENTION

This invention relates to discharging high voltage signals in electrical, and digital circuits.

BACKGROUND OF THE INVENTION

In a variety of integrated circuits, high voltage signals are used for various purposes. For instance, in non-volatile memory circuits, high voltage signals are used to erase and write data to the memory cells of the non-volatile memory. After the high voltage is applied within the memory device, the high voltage signal should be controllably discharged so as to reduce possible electrical interactions with any other portions of the circuit or device, such as through electrical coupling or transients or the like.

A high voltage signal, in this context, includes voltages which are outside of the normal power supply range of the integrated circuit. For example, in a circuit which operates on logic levels of zero to +5 volts, a high voltage signal would include a negative voltage reference of −5 volts, for example, referred to herein as the VNEG signal. While not shown in these figures, it is assumed that the high voltage signal VNEG is generated by a high voltage generating circuit capable of creating a high voltage signal such as −5 volts.

Referring now to FIG. 1, a circuit 10 for discharging a high voltage VNEG signal is illustrated. As shown in FIG. 1, the circuit includes logic 12, a plurality of high voltage switches 14a–c, discharge transistors 16, 18, and a clamp transistor 20 under the control of the logic 12.

The high voltage line VNEG is coupled to the drain of the discharge transistor 16, the drain of the extra discharge transistor 18, and the drain of the clamp transistor 20 shown in FIG. 1. The source of each of these transistors is coupled with ground, and the gate of each of the these transistors is coupled with the high voltage output for each high voltage switch 14. As can be seen in FIG. 1, a plurality of high voltage switches 14a,b,c are provided to drive the discharge and clamp transistors.

The two high voltage switches 14a,b are shown in block form and the third high voltage switch 14c is shown as a level shifter, in one example. Each high voltage switch has an input from the logic which controls the output of the high voltage switch. For instance, the third high voltage switch 14c provides an output which is the logical complement (shifted to a higher voltage level) of the signal the logic provides at the input of the high voltage switch. This output is coupled with the gate of the discharge transistor shown in FIG. 1.

In one example of the operation of the circuit of FIG. 1, initially, both discharge transistors 16, 18 are off so that the VNEG high voltage signal is allowed to go below ground to its high voltage level, for example, −5 volts. Once the high voltage signal VNEG has reached its high voltage level and the source (not shown) which created the high voltage signal VNEG turns off, the logic can direct the high voltage switch to activate the discharge transistor 16 or the extra discharge transistor 18. The discharge transistor 16 and the extra discharge transistor 18 provide a discharge path for the high voltage VNEG signal.

However, the discharge transistor 16 and the extra discharge transistor 18 may be subjected to "snapback" which is an abrupt change in the conducting characteristics of the discharge transistors due to high substrate current created at the drain side of the transistor under high drain to source biases. This high substrate or base current turns on the lateral drain to source bipolar parasitic device.

After the high voltage VNEG signal discharges to ground, the logic 12 enables the clamp transistor 20 to hold the high voltage signal VNEG at the ground potential so that any circuits which are coupled with the VNEG signal can properly operate during times at which the VNEG signal is not at its high voltage level of −5 volts, for example.

The implementation of FIG. 1 uses logic 12 to control the clamp transistor 20. In an integrated circuit which includes a large number of high voltage signal lines, such an implementation as in FIG. 1 may require a large number of high voltage switches and corresponding logic to control the same. Further, if multiple discharge paths are used in an integrated circuit, the implementation in FIG. 1 may utilize multiple high voltage switches and a discharge transistor for each discharge path.

As recognized by the present inventors, what is needed is a circuit for discharging a high voltage signal which includes a clamp transistor that automatically turns on or off without requiring additional logic or without utilizing high voltage switches.

It is against this background that various embodiments of the present invention were developed.

SUMMARY

According to one broad aspect of one embodiment of the invention, disclosed herein is a circuit for discharging a high voltage signal to a supply voltage line. In one embodiment, the circuit includes a first switch receiving the high voltage signal; a second switch having an input coupled with the output of the first switch; and a third switch having an input coupled with the output of the second switch and having an output coupled with the supply voltage line. In this embodiment, the high voltage signal discharges to the supply voltage line when the first, second, and third switches are on. An additional switch may be added to provide an extra discharge path, which in one embodiment, can be selected instead of or along with the third switch for discharging the high voltage signal.

In another embodiment, the circuit may include a fourth switch for clamping the high voltage signal to ground. The fourth switch may have a control coupled with the output of the first switch along a discharge path such that when the high voltage signal is discharging and approaches a voltage level of approximately ground, the fourth switch automatically turns on and clamps the high voltage signal to ground level. In this manner, after the high voltage signal has discharged, the fourth switch clamps the high voltage signal to a ground potential so that circuit elements coupled with the high voltage signal may operate.

In another embodiment, a fifth switch may be connected between the fourth switch and the ground connection of the fourth switch, so that when the fifth switch is off, the high voltage signal is not coupled with ground, which in one embodiment permits the high voltage signal to be driven from ground to its high voltage level when the high voltage signal is not discharging.

Embodiments of the circuit may be used in systems where the high voltage signals are either more negative than the logic levels of the circuit (i.e., where the high voltage signal is −5 volts) or are more positive than the logic levels of the circuit (i.e., where the high voltage signal is +10 volts).

In one embodiment where the high voltage signal to be discharged is a negative signal (for example −5 volts), the first switch may be a n-channel transistor, the second switch may be a p-channel transistor, the third switch may be a p-channel transistor, and the fourth switch may be a n-channel transistor.

In another embodiment where the high voltage signal to be discharged is a positive signal (for example +10 volts), the first switch may be a p-channel transistor, the second switch may be a n-channel transistor, the third switch may be a n-channel transistor, and the fourth switch may be a p-channel transistor.

Also disclosed herein is a method for discharging a high voltage signal. The method comprises providing a discharge path from the high voltage signal to a supply line; discharging the high voltage signal to the supply line through the discharge path; and providing a clamping device which senses the discharging. The clamping device activates, automatically in one example, when the high voltage signal approaches a voltage level of approximately the supply line.

In another embodiment, the clamping device deactivates when the clamping device detects that the high voltage signal is increasing in magnitude. In this manner, the clamping device may automatically sense whether it should be active or disabled, without the need for additional logic to control the clamping device. In one embodiment, the supply line may be a ground connection or alternatively, the supply line may be a positive supply reference.

The features, utilities and advantages of the various embodiments of the invention will be apparent from the following more particular description of a preferred embodiment of the invention as illustrated in the accompanying drawings.

DETAILED DESCRIPTION

Figure 1:
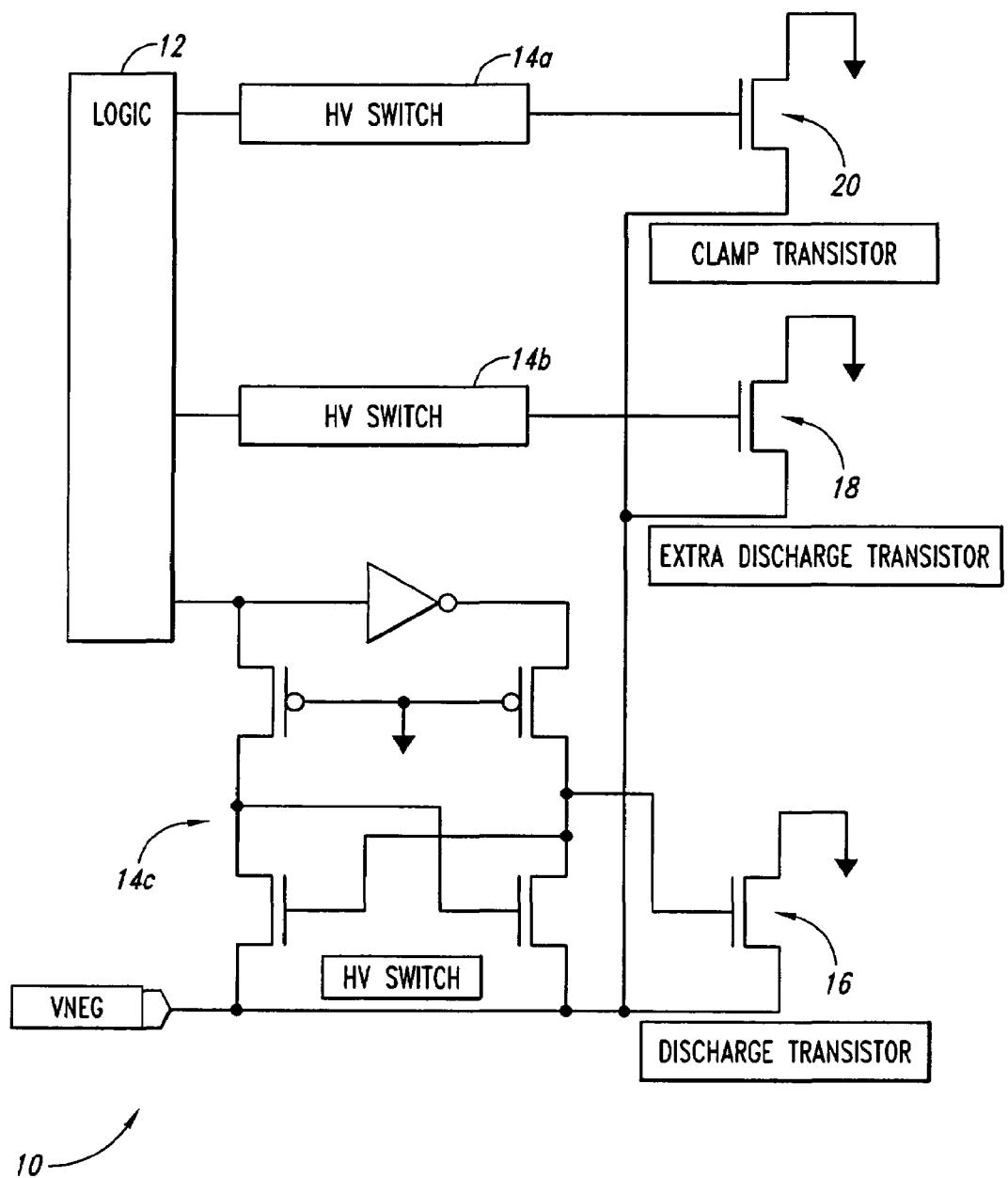
FIG. 1 illustrates a circuit for discharging a high voltage signal, wherein the circuit utilizes a plurality of high voltage switches or level shifters, along with clamp transistor under the control of logic.
Figure 2:
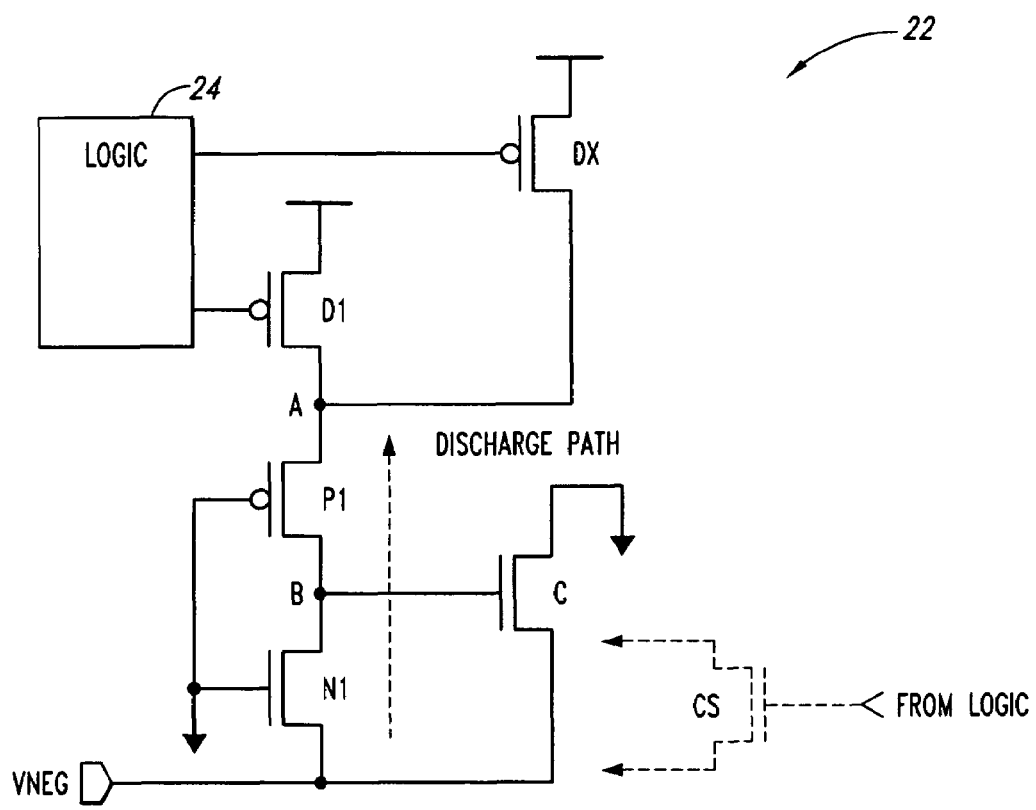
FIG. 2 illustrates a circuit for discharging a high voltage signal, in accordance with one embodiment of the present invention.

FIG. 2 illustrates a circuit 22 for discharging a high voltage signal according to one embodiment of the present invention. The circuit 22 includes a discharge transistor (D1), a discharge path through transistors (N1) and (P1), and a clamp transistor (C). An extra discharge transistor (DX) may also be provided, if desired, as will be explained below.

As used herein, the term "transistor" or "switch" includes any switching element which can include, for example, n-channel or p-channel CMOS transistors, MOS-FETs, FETs, JFETS, BJTs, or other like switching element or device. The particular type of switching element used is a matter of choice depending on the particular application of the circuit, and may be based on factors such as power consumption limits, response time, noise immunity, fabrication considerations, etc. While embodiments of the present invention are described in terms of p-channel and n-channel transistors, it is understood that other switching devices can be used. Further, embodiments of the present invention are described in terms of a circuit which utilizes logic levels of 0 volts (logic low) and +5 volts (logic high), where a high voltage signal can include voltages such as −5 volts or +10 volts. It is understood that embodiments of the present invention can be utilized in circuits wherein the voltage levels for the circuits are different, such as in a circuit which utilizes logic levels of 0 volts (logic low) and +3 volts (logic high), where a high voltage signal can include voltages such as −7 volts or +13 volts, in one example.

In this example of FIG. 2, the high voltage signal shown is the VNEG signal, which in one example is a high voltage signal which swings between 0 volts and its high voltage level of −5 volts. The high voltage signal VNEG is coupled to the source of the clamp transistor (C), which has its drain coupled to ground. The high voltage signal VNEG is also coupled with n-channel transistor (N1), which has its drain coupled to the drain of p-channel transistor (P1), in a series connection in one example. Both gates of transistors (N1) and (P1) are coupled with ground in one example. The gate of the clamp transistor (C) is coupled with the drain of transistor (N1).

The source of p-channel transistor (P1) is coupled with the drain of the discharge transistor (D1). If an extra discharge transistor (DX) is used, then the source of transistor (P1) may be coupled with the drain of the extra discharge transistor (DX). The source of discharge transistor (D1) (as well as extra discharge transistor (DX), if used) is coupled to the positive supply of the circuit in one example.

A discharge path may be formed from the high voltage signal line VNEG through transistor (N1) in series with transistors (P1) to the discharge transistors, (D1) or (DX). In one embodiment, a logic circuit 24 selects either (D1) or (DX) as a discharge path, depending upon the particular implementation. Accordingly, if the logic 24 selects discharge transistor (D1) as the discharge path, then the high voltage signal VNEG discharges through transistors (N1), (P1), and (D1). Alternatively, if the logic 24 selects the discharge transistor (DX) as the discharge path, then the logic 24 disables discharge transistor (D1) such that the discharge path is from the high voltage signal VNEG through the series combination of transistors (N1), (P1) and (DX).

In one embodiment, transistor (N1) is made larger than transistor (P1) by an amount, for example, of five times bigger in strength, so that node B is at or near the VNEG level during discharge to keep transistor (C) off while VNEG is being discharged and also to keep the N1 drain to source voltage low to avoid bipolar snapback.

As shown in FIG. 2, the logic circuit 24 controls the gate of discharge transistor (D1), as well as the gate of the extra discharge transistor (DX), if used. In one embodiment, where the supply voltage of the circuit is large, transistor (D1) can be sized using a smaller geometry (i.e., one micron width by 0.5 micron length) for the discharge of the high voltage signal VNEG. When the high voltage VNEG is to be discharged to a lower supply signal, the extra discharge transistor (DX) can be used, particularly if the extra discharge transistor (DX) is of a larger geometry (i.e., 5 microns width by 0.5 micron length) when compared with discharge transistor (D1).

In overall operation, assume the high voltage signal VNEG is transitioning from zero volts to its high voltage level of, for example, −5 volts. During this time, the logic 24 disables the discharge transistors D1 (and DX, if present) so as to open circuit the discharge path from the perspective of the high voltage signal VNEG.

When the VNEG signal is driven from zero volts to −5 volts, transistors (D1) and (DX) are off (under the control of the logic); and transistor (N1) is on because its gate voltage (i.e., 0 volts) is greater than its source voltage. Since transistor (N1) is on, the gate of transistor (C) is set to the level of approximately VNEG which turns transistor C off. Accordingly, the clamp transistor (C) turns off automatically when the high voltage supply VNEG is approximately between zero and −5 volts and when the discharge transistors are disabled.

After the high voltage signal VNEG reaches its desired high voltage level and VNEG performs its desired function in the integrated circuit application (i.e., to program or erase a memory cell), then it is assumed that the circuit (not shown) which generates the VNEG signal stops driving the VNEG signal to the high voltage level.

As the high voltage signal VNEG is released so that it can be discharged, the logic 24 activates one or more of the discharge transistors, such as by activating discharge transistor (D). When transistor (D1) is activated, the source of transistor (P1) is approximately 5 volts (i.e., the supply voltage), and both transistors (P1) and (N1) are on such that the high voltage signal VNEG can discharge through the series combination of transistors (N1), (P1) and (D1) in this example. If the logic 24 selects transistor (DX) as the discharge transistor, then the discharge path may be through transistors (N1), (P1), and (DX).

As the voltage of the high voltage signal VNEG approaches a value of a n-channel threshold voltage below ground, the clamp transistor (C) automatically turns on so that it clamps the high voltage signal VNEG to ground potential through clamp transistor (C). In this manner, any other circuits that utilize the high voltage signal VNEG will now receive the VNEG signal clamped to ground, in one example. In one example, the clamping transistor (C) is made relatively large so that it can effectively clamp the high voltage signal VNEG to ground.

FIG. 2 also illustrates another embodiment of the present invention. As shown in FIG. 2, an additional transistor (CS) may be coupled in series with clamping transistor (C) and the high voltage signal VNEG. The series clamp transistor (CS) has its gate coupled to the logic 24 in one embodiment, so that the logic 24 can turn off the transistor (CS) to prevent any current from VNEG to pass through the clamp transistor (C).

In situations where a low powered pump or supply circuit is being used to drive the high voltage signal VNEG below ground, the clamp transistor (C) may be too strong for the high voltage signal line VNEG to get below ground when VNEG is trying to be driven to its high voltage level. In this case, the clamp transistors (C) may prevent VNEG from reaching its high voltage level.

Accordingly, a series transistor (CS) can be provided. In one embodiment, when the transistor (CS) is turned off, it prevents any current from the VNEG supply to be passed through the clamp transistor (C) to ground, which thereby permits the VNEG signal to reach its high voltage level, such as −5 volts, when the VNEG high voltage signal is increasing. In one embodiment, the logic 24 disables series transistor (CS) when the discharge transistors (D1) and/or (DX) turn off under the control of logic 24.

When discharge transistors (D1) or (DX) are turned on to discharge the high voltage signal VNEG, the transistor (CS) can turn on at the same time to allow clamp transistor (C) to operate automatically as previously described. While the series transistor (CS) is shown coupled between the VNEG signal and the clamp transistor (C), it is understood that the series transistor (CS) could be positioned on the drain side of the clamp transistor between ground.

Figure 3:
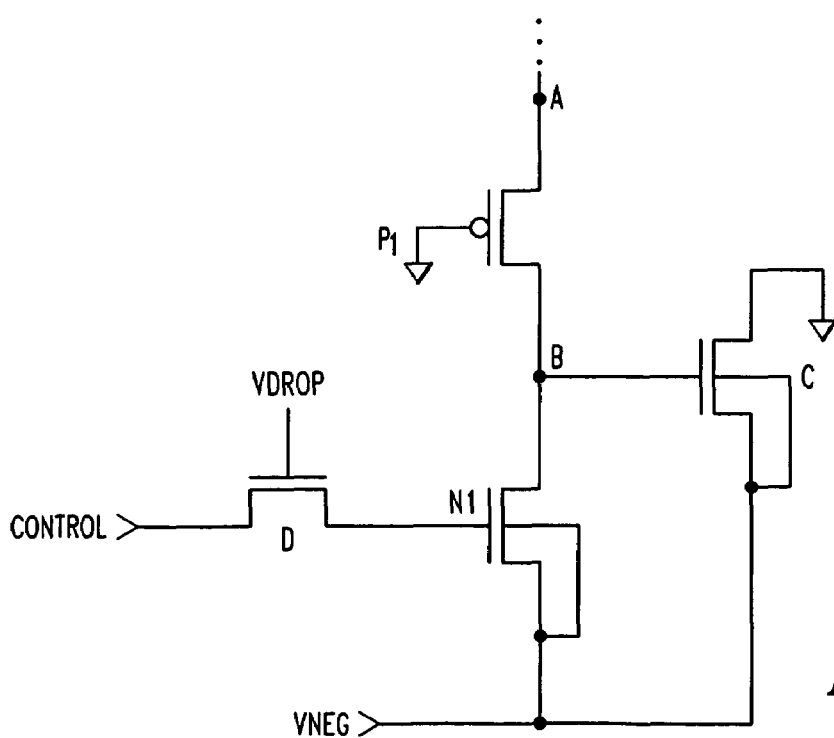
FIG. 3 illustrates an alternative embodiment of a portion of the circuit of FIG. 2, in accordance with one embodiment of the present invention.

FIG. 3 illustrates an alternative embodiment for the arrangement of the transistors (N1), (P1), and (C) of FIG. 2 in accordance with one embodiment of the present invention. As shown in FIG. 3, the transistor (P1) has its source coupled with the discharge transistor through node A, and transistors (P1) and (N1) are in a series combination in a manner similar to that of FIG. 2. The gate of transistor (P1) is coupled with ground, while the gate of transistor (N1) is coupled with the output of a transistor (D), which when activated by a signal (shown as the VDROP signal) at its gate, couples the gate of transistor (N1) to a control signal.

In one example, a signal VDROP is active low and is provided by a circuit described in the co-pending, commonly assigned patent application "Level Shifting Circuit and Method", wherein the VDROP signal is a signal which indicates that the VNEG high voltage signal has reached a particular level between zero volts and its high voltage level of, for example, −5 volts. The co-pending application is especially incorporated herein by reference in its entirety.

The control signal shown in FIG. 3 is a signal which, in one example, is the same control signal which drives the generator of the high voltage signal VNEG. Accordingly, in the circuit of FIG. 3, when the control signal is asserted and the VDROP signal is high (i.e., VNEG has not yet reached a value −V2 where 0>−V2>−5 volts), transistor D turns on which assures that transistor N1 turns on, which sets node B to approximately a voltage level of VNEG, which therefore turns off clamp transistor (C), automatically and momentarily, based on the level of the VNEG signal, so that the VNEG signal can increase to a level of at least −VTN. Once VNEG has become more negative than VTN, then VNEG can become even more negative without being affected by the clamp transistor (C), and transistor (D) can be disabled.

In order to discharge the high voltage signal VNEG, which in this example is assumed to be below ground at −5 volts, the control signal is set to low or ground and the logic turns on discharge transistors (D1) or (DX). Transistors (N1) and (P1) are on, while clamp transistor (C) stays off. Accordingly, the high voltage signal VNEG starts to discharge to the supply line through the series combination of transistors (N1), (P1) and (D1) or (DX).

By turning the gate of transistor (N1) high when the discharge transistors (D1) and/or (DX) turn off, node B goes to the VNEG potential to turn off clamping transistor (C). In this manner, the clamping transistor (C) will remain off while the VNEG signal is driven to its high voltage level of, for example, −5 volts.

The drain to source voltage over transistor (N1) is relatively small, thereby reducing bipolar snapback under transistor (N1) during the discharge operation.

When the high voltage signal VNEG reaches approximately a value of −VTN, then transistor (N1) and transistor (P1) are off, and the voltage at nodes B and A are approximately equal and approximately the value of the supply voltage. The clamping transistor (C) turns on automatically, which discharges the remaining voltage value of VNEG to ground as well as clamping the VNEG signal line to ground.

Figure 4:
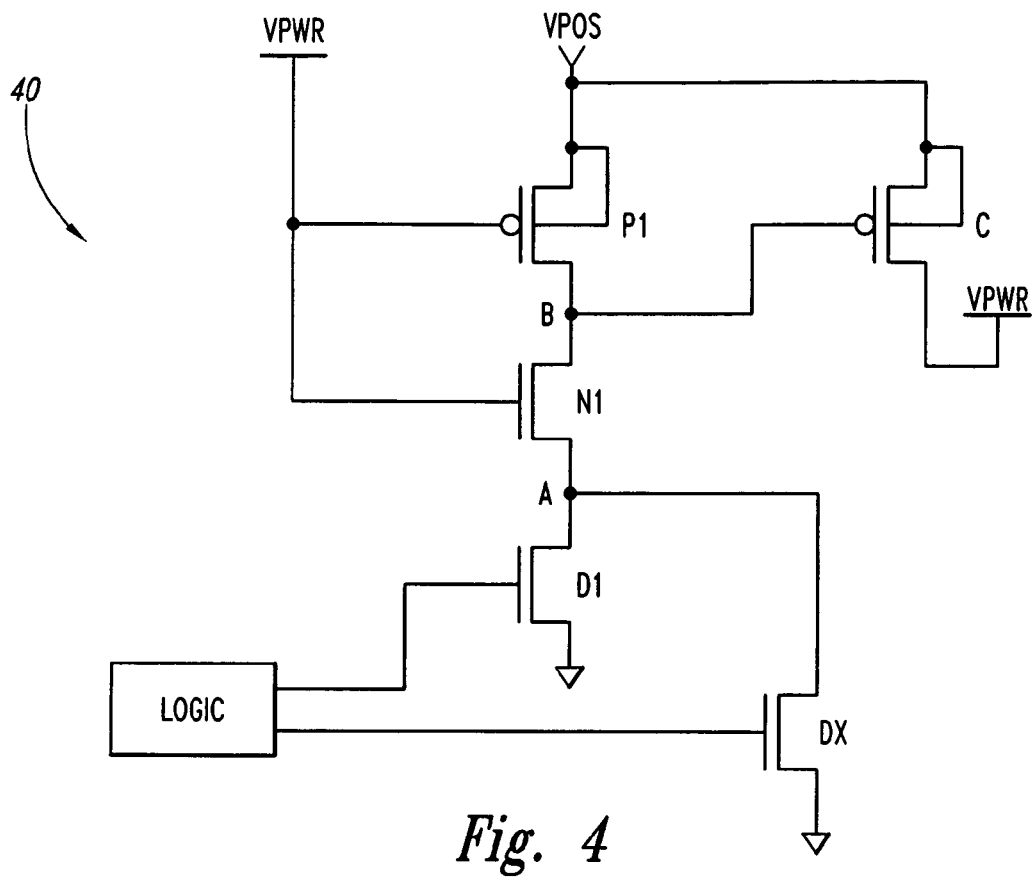
FIG. 4 illustrates a circuit for discharging a high voltage signal, in accordance with one embodiment of the present invention.

Referring now to FIG. 4, FIG. 4 shows an alternative embodiment of a discharge circuit 40 in accordance with an embodiment of the present invention. In circuit 40, a high voltage signal VPOS is discharged through the series combination of (P1), (N1) and (D1) or (DX). A clamping transistor (C) is provided which automatically turns off while the high voltage signal VPOS is active and the clamping transistor (C) automatically turns on when the high voltage signal VPOS has discharged to approximately the supply voltage, shown as VPWR.

In circuit 40, the high voltage signal VPOS ranges in value from 5 volts to 10 volts in one example. The supply signal VPWR, can be, for instance 3.3 volts or 5 volts, depending upon the particular implementation.

Circuit 40 is the complementary version of circuit 22 of FIG. 2, and accordingly works in a similar manner as explained above. A series transistor (CS) (not shown in FIG. 4) can be added in series with to the clamp transistor (C), in a manner as described with reference to FIG. 2, in order to disable the clamp transistor (C) when the high voltage signal VPOS is being driven to its high voltage level. Accordingly, the circuit 40 of FIG. 4 can be used to controllably discharge high voltage signals such as VPOS, which are above the positive power supply voltage levels.

Figure 5:
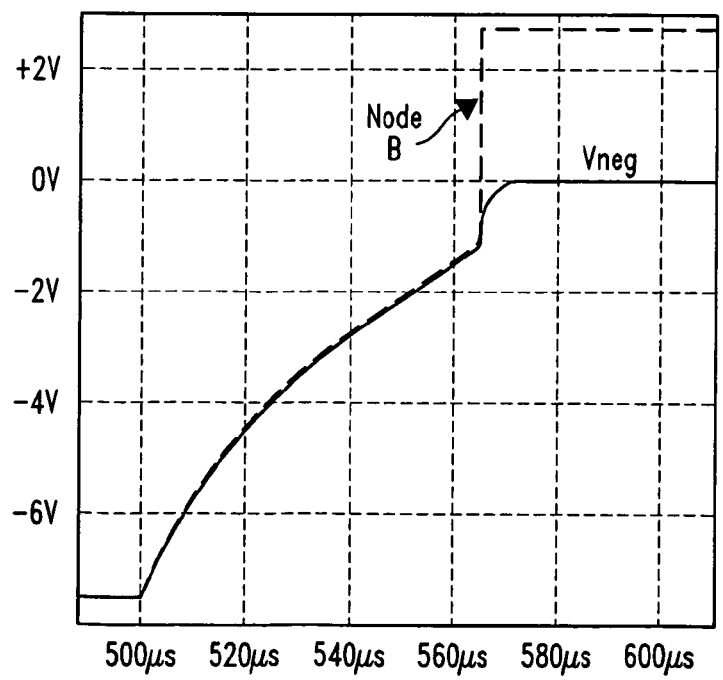
FIG. 5 illustrates a graph of one example of a high voltage signal VNEG discharging through the use of one embodiment of the present invention.

FIG. 5 illustrates a graph of the discharge of the VNEG as it discharges in the circuit 22 of FIG. 2. FIG. 5 also illustrates the voltage at node B shown in an example of FIG. 2. In this example, at 500 microseconds, transistor (D1) turns on and the high voltage signal VNEG is seen to slowly discharge to ground. Node B has a similar discharge characteristic as the VNEG signal until the VNEG signal reaches near −1.5 volts to turn off transistor (N1). Node B then goes high to turn on clamp transistor (Cl), which clamps the high voltage signal VNEG to ground at approximately 570 microseconds shown in FIG. 5.

Hence, the embodiment described herein provide discharge of high voltage signals with clamps that automatically turn off when the discharge transistors are off, and the clamp transistor automatically turns on when a discharge transistor turns on and the high voltage signal approaches a voltage supply level, such as a ground potential (for discharging a negative high voltage signal) or a positive supply level (for discharging a positive high voltage signal). Hence, it can be seen that embodiments of the present invention can simplify the circuitry for discharging a high voltage signal.

Figure 6:
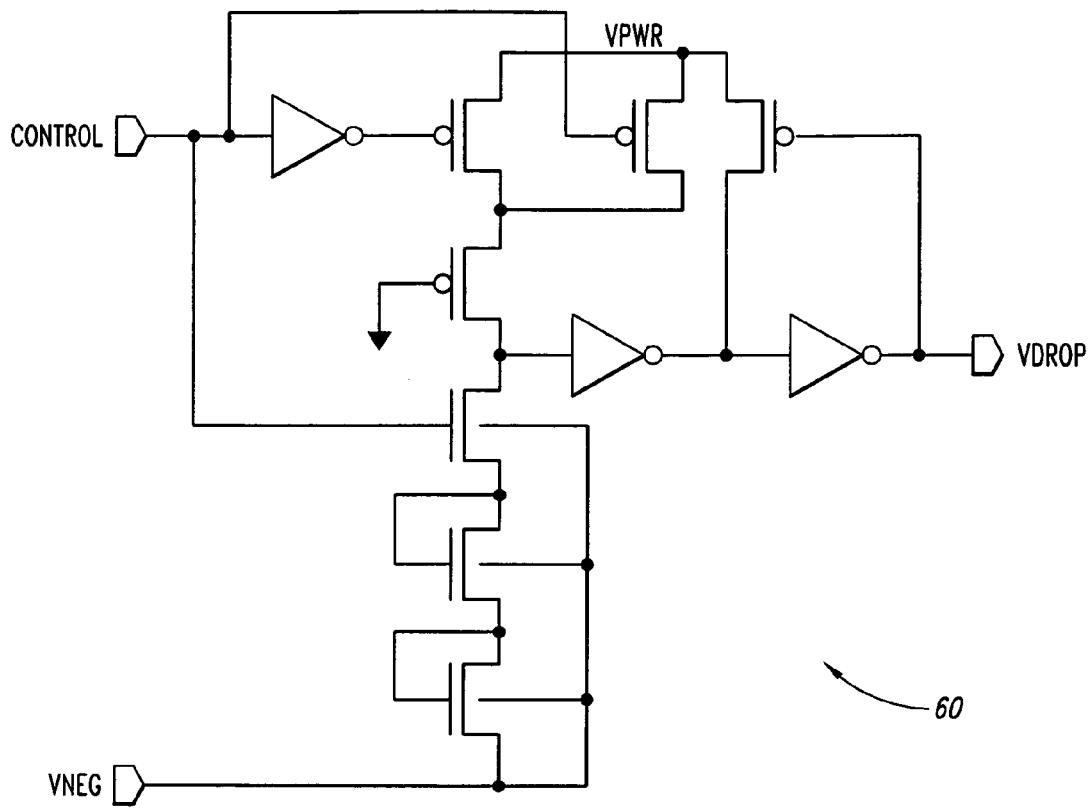
FIG. 6 illustrates an example of a circuit to generate the VDROP signal shown in FIG. 3, in accordance with one embodiment of the present invention.

FIG. 6 illustrates one example of a circuit 60 to generate the VDROP signal shown in FIG. 3, in accordance with one embodiment of the present invention. This circuit is also described in the commonly assigned co-pending application entitled "LEVEL SHIFTING CIRCUIT AND METHOD," filed on Dec. 20, 2001, incorporated by reference above.

The circuit 60 of FIG. 6 generates a voltage drop control signal VDROP (active low) based on a control input signal (CONTROL) (active high) and the generated negative voltage VNEG. Circuit 60 provides the VDROP signal to switch from +5 volts (inactive) to 0 volts (active) when the VNEG input signal reaches a voltage level of −V2, wherein −V2 is more negative than ground. In this manner, circuit 60 of FIG. 6 provides the VDROP signal to controllably indicate the occurrence of this event.

The control signal shown in FIG. 6 is an input signal to circuit 60 and, in one embodiment, is the same signal that instructs the VNEG generator to begin generating a high voltage signal of −5 volts. Therefore, when the control signal is active, the VNEG generator begins to generate a negative voltage, and as the VNEG voltage signal reaches the level of (−V2), the VDROP signal accordingly indicates the occurrence of this event. Hence, the VDROP signal can be viewed as a signal which indicates the detection that the VNEG generated signal has reached a particular negative level.

Accordingly, in one embodiment, the output signal VDROP generated by circuit 60 can be used to enable or disable transistor (N1) so that the clamp transistor (C) is turned off when the VNEG signal is trying to be increased to its high voltage level of, for example, −5 volts.

Embodiments of the present invention can be used in a variety of circuits where high voltage signals are used, such as in non-volatile memory circuits or programmable logic devices. For instance, in a non-volatile memory circuit, embodiments of the present invention may be used to discharge high voltage write or erase signals which may be applied to one or more portions of the non-volatile memory.

Figure 7:
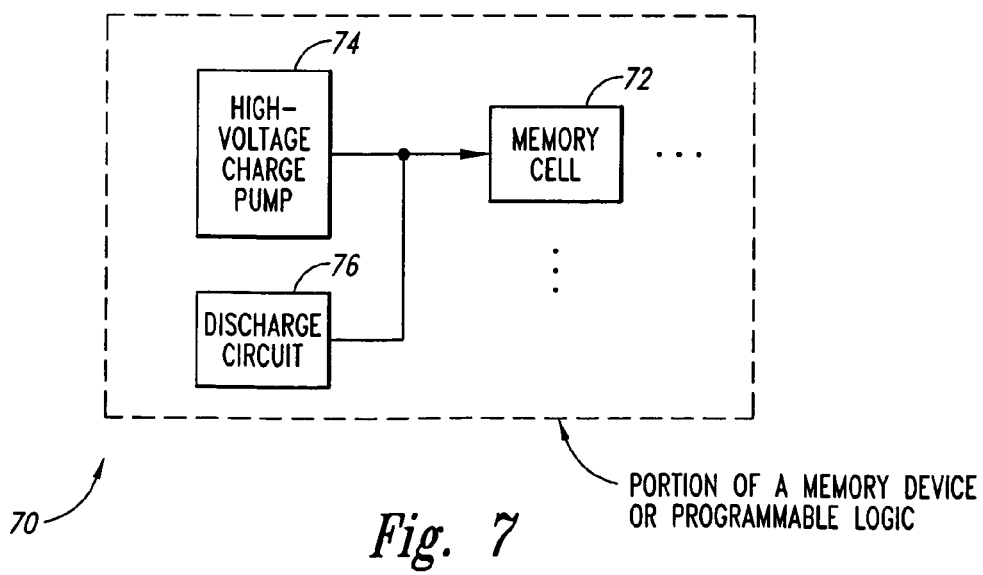
FIG. 7 illustrates one example of a non-volatile memory having a plurality of memory cells, charge pumps, and one or more circuits for discharging high voltage signals, according to an embodiment of the present invention.

FIG. 7 illustrates one example of a non-volatile memory 70 having a plurality of memory cells 72, charge pumps 74, and discharge circuits 76 according to embodiments of the present invention. In one embodiment, memory device 70 has a plurality of memory cells 72, and associated the cells are one or more charge pumps 74 for applying high voltages thereto. One example of a non-volatile memory device is described in commonly owned U.S. Pat. No. 5,506,816, entitled "Memory Cell Array Having Compact Word Line Arrangement," issued on Apr. 9, 1996, the disclosure of which is expressly incorporated herein by reference in its entirety.

As shown in FIG. 7, a circuit 76 for discharging one or more of the high voltage signals may be used in the non-volatile memory device 70, wherein the discharge circuit may incorporate a clamping transistor that automatically turns on or off.

While the methods disclosed herein have been described and shown with reference to particular operations performed in a particular order, it will be understood that these operations may be combined, sub-divided, or re-ordered to form equivalent methods without departing from the teachings of the present invention. Accordingly, unless specifically indicated herein, the order and grouping of the operations is not a limitation of the present invention.

While the invention has been particularly shown and described with reference to various embodiments thereof, it will be understood by those skilled in the art that various other changes in the form and details may be made without departing from the spirit and scope of the invention.

What is claimed is:

1. A circuit for discharging a high voltage signal to a supply voltage line, the circuit comprising:

a first switch receiving the high voltage signal, the first switch having an output;

a second switch having an input coupled with the output of the first switch, the second switch having an output;

a third switch having an input coupled with the output of the second switch, the third switch having an output coupled with the supply voltage line; and a fourth switch for clamping said high voltage signal to a ground, the fourth switch having an input coupled with the high voltage signal and an output coupled with said ground;

wherein when the first, second, and third switches are on, the high voltage signal discharges to the supply voltage line; and wherein the fourth switch has a control coupled with the output of the first switch such that when the high voltage signal is discharging and approaches a voltage level of approximately said ground, the fourth switch turns on and clamps the high voltage signal to said ground.

2. The circuit of claim 1, further comprising:
control logic for selectively activating the third switch.

3. The circuit of claim 1, wherein the high voltage signal is a signal in the range of 0 to −5 volts.

4. The circuit of claim 1, wherein the high voltage signal is a signal in the range of approximately 0 to −3.3 volts.

5. The circuit of claim 1, wherein the first switch is a n-channel transistor.

6. The circuit of claim 1, wherein the second switch is a p-channel transistor.

7. The circuit of claim 1, wherein the third switch is a p-channel transistor.

8. The circuit of claim 1, wherein the high voltage signal is a signal in the range of 5 to 10 volts.

9. The circuit of claim 1, wherein the first switch is a p-channel transistor.

10. The circuit of claim 1, wherein the second switch is a n-channel transistor.

11. A circuit for discharging a high voltage signal to a supply voltage line, the circuit comprising:

a first switch receiving the high voltage signal, the first switch having an output;

a second switch having an input coupled with the output of the first switch, the second switch having an output;

a third switch having an input coupled with the output of the second switch, the third switch having an output coupled with the supply voltage line;

wherein when the first, second, and third switches are on, the high voltage signal discharges to the supply voltage line;

a fourth switch for clamping said high voltage signal to a ground, the fourth switch having an input coupled with the high voltage signal and an output; and a fifth switch having an input coupled with the output of the fourth switch and an output coupled with said ground, wherein when the fifth switch is off, the high voltage signal is not coupled with ground.

12. A circuit for discharging a high voltage signal to a supply voltage line, the circuit comprising:

a first switch receiving the high voltage signal, the first switch having an output;

a second switch having an input coupled with the output of the first switch, the second switch having an output;

a third switch having an input coupled with the output of the second switch, the third switch having an output coupled with the supply voltage line;

wherein when the first, second, and third switches are on, the high voltage signal discharges to the supply voltage line;

a fourth switch having an input coupled with the output of the second switch, the fourth switch having an output coupled with the supply voltage line; and control logic for selectively activating either the third switch or the fourth switch to discharge the high voltage signal.

13. A circuit for discharging a high voltage signal to a supply voltage line, the circuit comprising:

a first switch receiving the high voltage signal, the first switch having an output;

a second switch having an input coupled with the output of the first switch, the second switch having an output;

a third switch having an input coupled with the output of the second switch, the third switch having an output coupled with the supply voltage line;

wherein when the first, second, and third switches are on, the high voltage signal discharges to the supply voltage line; and a fourth switch for clamping said high voltage signal to a ground, the fourth switch having an input coupled with the high voltage signal and an output coupled with said ground;

wherein the fourth switch is a n-channel transistor.

14. A circuit for discharging a high voltage signal to a supply ground voltage line, the circuit comprising:

a first switch receiving the high voltage signal, the first switch having an output;

a second switch having an input coupled with the output of the first switch, the second switch having an output; and a third switch having an input coupled with the output of the second switch, the third switch having an output coupled with the supply ground voltage line;

wherein when the first, second, and third switches are on, the high voltage signal discharges to the supply ground voltage line;

wherein the third switch is a n-channel transistor; and wherein the first switch is a p-channel transistor having its gate coupled with a positive supply voltage signal.

15. A circuit for discharging a high voltage signal to a supply voltage line, the circuit comprising:

a first switch receiving the high voltage signal, the first switch having an output;

a second switch having an input coupled with the output of the first switch, the second switch having an output;

a third switch having an input coupled with the output of the second switch, the third switch having an output coupled with the supply voltage line;

wherein when the first, second, and third switches are on, the high voltage signal discharges to the supply voltage line;

a fourth switch for clamping said high voltage signal to a ground, the fourth switch having an input coupled with the high voltage signal and an output coupled with said ground; and wherein the fourth switch is a p-channel transistor.

16. A method for discharging a high voltage signal, the method comprising:

providing a discharge path from the high voltage signal to a supply line;

discharging the high voltage signal to the supply line through the discharge path; and providing a clamping device which senses said discharging, said clamping device activating when the high voltage signal approaches a voltage level of approximately said supply line.

17. The method of claim 16, wherein the clamping device deactivates when the clamping device detects that the high voltage signal is increasing in magnitude.

18. The method of claim 16, wherein the supply line is a ground connection.

19. The method of claim 16, wherein the supply line is a positive supply reference.

* * * * *